(12) United States Patent
Kumakura et al.

(10) Patent No.: US 6,855,893 B2
(45) Date of Patent: Feb. 15, 2005

(54) WIRING BOARD, SEMICONDUCTOR DEVICE, ELECTRONIC DEVICE, AND CIRCUIT BOARD FOR ELECTRONIC PARTS

(75) Inventors: Toyohiko Kumakura, Ibaraki (JP); Gen Murakami, Tokyo (JP); Tomo Yasuda, Ibaraki (JP); Masahiko Kobayashi, Ibaraki (JP); Hidetoshi Murakami, Ibaraki (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 10/304,858

(22) Filed: Nov. 27, 2002

(65) Prior Publication Data

US 2004/0211591 A1 Oct. 28, 2004

Related U.S. Application Data

(62) Division of application No. 09/237,860, filed on Jan. 27, 1999, now abandoned.

(30) Foreign Application Priority Data

Jan. 27, 1998 (JP) .............................................. 10-14312
Jan. 30, 1998 (JP) .............................................. 10-19205

(51) Int. Cl.[7] ................................................. H05K 1/16
(52) U.S. Cl. ........................ 174/260; 361/818; 257/787
(58) Field of Search ........................ 361/818; 174/260; 257/690–700, 787–796, 687, 728

(56) References Cited

U.S. PATENT DOCUMENTS 4,357,585 A    11/1982  Wirth
4,367,585 A *  1/1983  Elliott et al. ................. 257/778
4,441,088 A    4/1984  Anderson
4,578,529 A    3/1986  Look
4,707,671 A    11/1987  Suzuki et al.
4,798,918 A    1/1989  Kabadi et al.
4,885,431 A    12/1989  Kawakami et al.
4,902,236 A    2/1990  Hasircoglu
5,436,203 A *  7/1995  Lin .............................. 29/841
5,656,857 A *  8/1997  Kishita ........................ 257/690
5,796,170 A *  8/1998  Marcantonio ................ 257/786
6,570,469 B2 * 5/2003  Yamada et al. ............. 333/193
6,661,103 B2 * 12/2003 Akram ........................ 257/787

* cited by examiner

Primary Examiner—Kamand Cuneo
Assistant Examiner—Jeremy Norris
(74) Attorney, Agent, or Firm—McDermott Will & Emery LLP

(57) ABSTRACT

A wiring board includes a predetermined wiring section disposed on an insulation board, and an electromagnetic shielding film is placed at a position close to the wiring section. A semiconductor device includes an electromagnetic shielding film disposed on a surface, on which an integrated circuit of a semiconductor chip has been formed, through an insulative film, a lead is provided on the electromagnetic shielding film through an insulative film, the lead is electrically connected to an external terminal of the semiconductor chip, and the resulting structured material is sealed with a sealing material; and a circuit board for electronic parts composed of a circuit board prepared by forming a plurality of leads on an insulating material, and a conductor disposed on the plurality of leads through an insulating material and reducing a self inductance of the plurality of leads by flowing an eddy current through the conductor.

6 Claims, 17 Drawing Sheets (a) LEAD INTERVAL AS SHOWN (b) NARROW PORTION OF LEAD BEING SET TO 150 μm (c) CALCULATION OF CASE WITH ELECTROMAGNETIC SHIELDING FILM

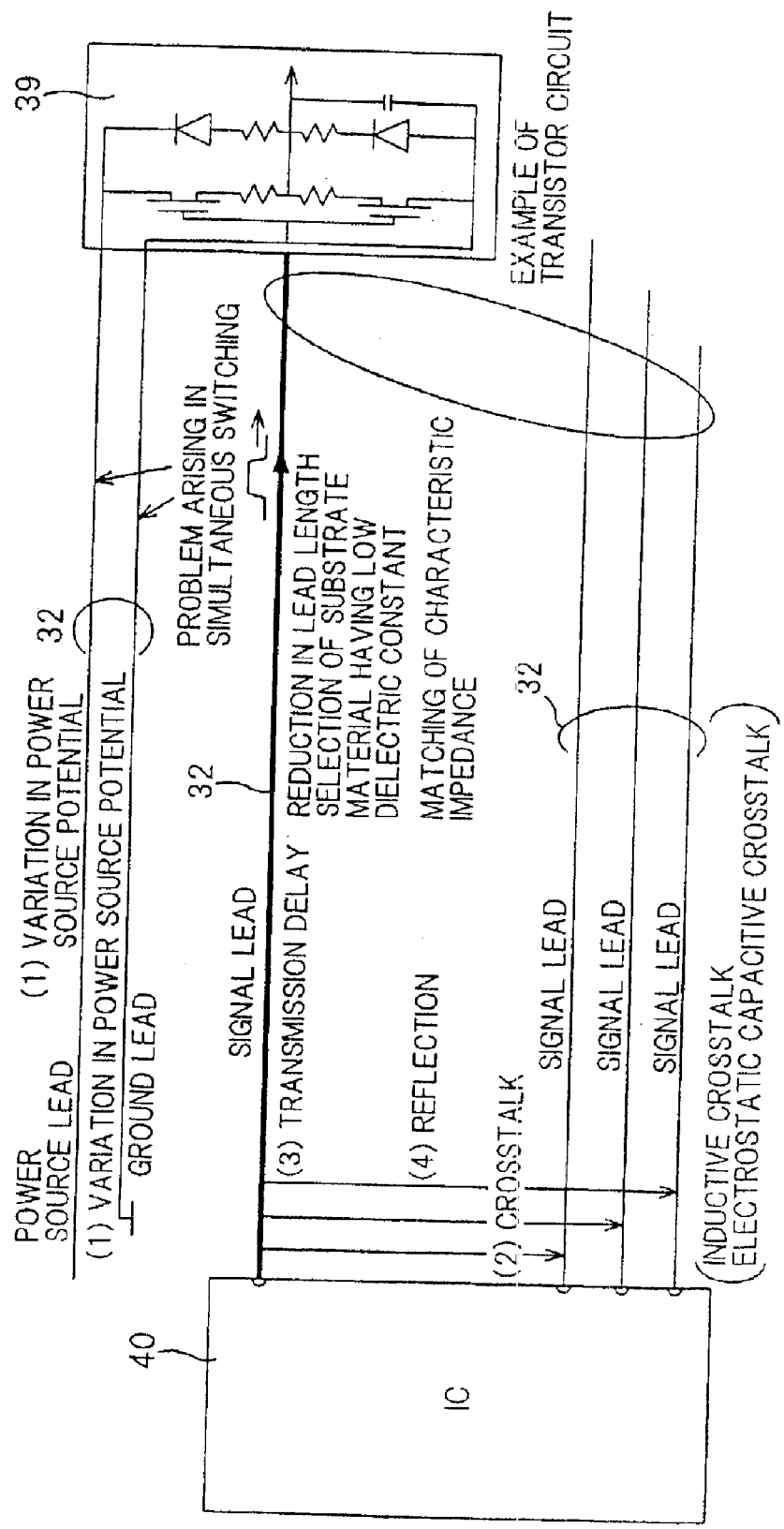

WIRING BOARD, SEMICONDUCTOR DEVICE, ELECTRONIC DEVICE, AND CIRCUIT BOARD FOR ELECTRONIC PARTS

This application is a divisional of application Ser. No. 09/237,860 filled Jan. 27, 1999 now abandoned.

FIELD OF THE INVENTION

The present invention relates to a wiring board, a semiconductor device, and an electronic device, and particularly to a technology by which reduction in an inductance of a wiring section in a wiring board for mounting on a semiconductor device or that of a wiring section composed of leads in a package of such semiconductor device as well as reduction in inductive cross talk noise can be achieved.

Furthermore, the invention relates to a circuit board for electronic parts, and particularly to a circuit board for electronic parts by which its characteristic impedance can easily be adjusted.

BACKGROUND OF THE INVENTION

In also the world of digital circuits, trends of speeding up operations proceed, so that there were the cases wherein, for example, operation characteristics of a semiconductor chip to be mounted are affected by a finished state of a board circuit as in the world of analog circuits. Characteristic impedance of line (wiring) is decided by a type of materials, a distance of an insulating material to be inserted between the board and a plate-like ground layer, or a pitch defined between leads and the like. In this respect, since such board circuit is fabricated in a dimension region which is close to the limit of the present manufacturing engineering, it can be made clear for the first time whether or not the resulting board circuit is the one which is suited for operation characteristics of a semiconductor chip to be mounted after having been finished. In the world of analog circuits, matching work is conducted to readjust a joined position of parts while confirming operation characteristics of a semiconductor chip, whereby adjustment has been performed.

At present, since use of a wiring board such as a TAB (Tape Automated Bonding) tape becomes possible, fine wiring with 30 micron ($\mu$m) to 60 $\mu$m pitch can be made.

As a result of studying the above described prior art, the present inventors have found the following problems.

There is such a problem that since the number of products to be fabricated increases extraordinarily in the world of the above described conventional digital circuits, it becomes very difficult to apply matching work in a manner of individual response.

With respect to a systematic malfunction, merely such a manner that a typical sample is selected to make clear a procedure for adjusting operation, and a manner for such adjustment is incorporated in a flow of working processes may be adopted. Accordingly, there is such a problem that a manner of adjustment which can be incorporated in such an assembly-line method must be at least ensured.

On one hand, speeding up of data transmission brings about a new problem in generation of noise due to electromagnetic field coupling appeared between leads of fine pitch wiring in a wiring board such as the above described TAB tape, and such problem became the one which cannot be disregarded. There was such a problem that a ringing (resonance) phenomenon arose between leads which are disposed apart from one another with 30 $\mu$m interval, so that a signal waveform of clock pulse gets remarkably out of shape.

For instance, when a BGA (Ball Grid Array) of CSP type is mounted as a semiconductor device, influence of noise due to a mutual inductance between wiring leads in a package becomes a problem in view of operation characteristics.

SUMMARY OF THE INVENTION

Accordingly, an object of the present invention is to provide a technology by which an inductance of a wiring section arranged in a usual wiring board or that of a wiring section composed of leads in a semiconductor package as well as inductive cross talk can be reduced.

Another object of the invention is to provide a technology by which reduction in an inductance of a wiring section provided on a wiring board such as a TAB tape composed of a semiconductor device or reduction in an inductance of a wiring section composed of leads in its semiconductor package as well as reduction in inductive cross talk can be achieved.

A farther object of the invention is to provide a circuit board for electronic parts by which its characteristic impedance of the circuit board can be easily adjusted even in a field of digital circuits which have been fabricated in an extraordinary number.

These and other objects will become apparent from the following detailed description taken in connection with the accompanying drawings.

According to the first feature of the invention, a wiring board, comprises:

a predetermined wiring section being disposed on an insulation board; and an electromagnetic shielding film being placed at a position close to the wiring section.

In the wiring board, conditions for disposing the wiring section as well as for the electromagnetic shielding film, a condition for physical properties required for the electromagnetic shielding film, and a condition for frequency to be applied being selected so as to decrease an inductance of the wiring section as well as inductive cross talk.

According to the second feature of the invention, a semiconductor device, comprises:

an electromagnetic shielding film being disposed on a surface, on which an integrated circuit of a semiconductor chip has been formed, through an insulating film;

a lead is provided on the electromagnetic shielding film through an insulating film;

the lead is electrically connected to an external terminal of the semiconductor chip; and the resulting structured material being sealed with a sealing material.

According to the third feature of the invention, an electronic device, comprises:

the wiring board as described in the above first feature; and the semiconductor device as described in the above second feature which is to be mounted on the wiring board.

In accordance with the above-mentioned manners, since a predetermined wiring section is disposed on an insulation board and an electrostatic shielding film (metallic foil) is placed at a position close to the wiring section, an eddy current flows on the electromagnetic shielding film placed at a position close to the wiring section in a direction wherein a magnetic flux produced by a current flowing through each lead of the wiring section of a wiring board is canceled. As a result, inductances (self inductance and mutual inductance between leads) of the wiring section as well as inductive cross talk can be reduced, whereby it is intended to improve reliability of electric signals and to speed up for transmission speed.

According to the fourth feature of the invention, a circuit board for electronic parts, comprises:

a circuit board prepared by forming a plurality of leads on an insulating material; and a conductor disposed on the plurality of leads through an insulating material and reducing a self inductance of the plurality of leads by flowing an eddy current through the conductor.

In the above fourth feature, an example of the insulating material includes films made of polyimide, polyamide-imide and the like, while an example of the conductor includes foils prepared from copper, aluminum, and alloys obtained therefrom.

It is desirable that such foil-like material has a thickness of at least 10 µm in order to obtain a required strength.

It is usual to use the insulating material and the conductor in the form of a composite sheet wherein they are laminated with each other. The resulting composite sheet is bonded onto leads of a circuit board with an adhesive layer formed on the insulating material.

An example of such adhesive includes the ones which are prepared from a variety of synthetic resins such as epoxy resin, and polyester resin.

Although the adhesive may be applied to a composite sheet to form a layer at the time when the composite sheet is bonded to a circuit board, it is desired that such adhesive layer has been previously formed on the composite sheet in order to efficiently proceed an operation of characteristic arrangement.

While the composite sheet may be bonded directly to leads on the circuit board, it may be bonded on the leads through another insulating material, or an insulating layer may be formed on a conductor of the composite sheet.

BRIEF DESCRIPTION OF THE DRAWINGS

The present invention will be explained in more detail in conjunction with appended drawings, wherein:

FIG. 17 is a view for explaining a cause for generating noise in a high frequency region;

DESCRIPTION OF THE PREFERRED EMBODIMENT

The invention will be described in detail hereinafter in conjunction with preferred embodiments by referring to the accompanying drawings.

(The First Preferred Embodiment)

Figure 1:
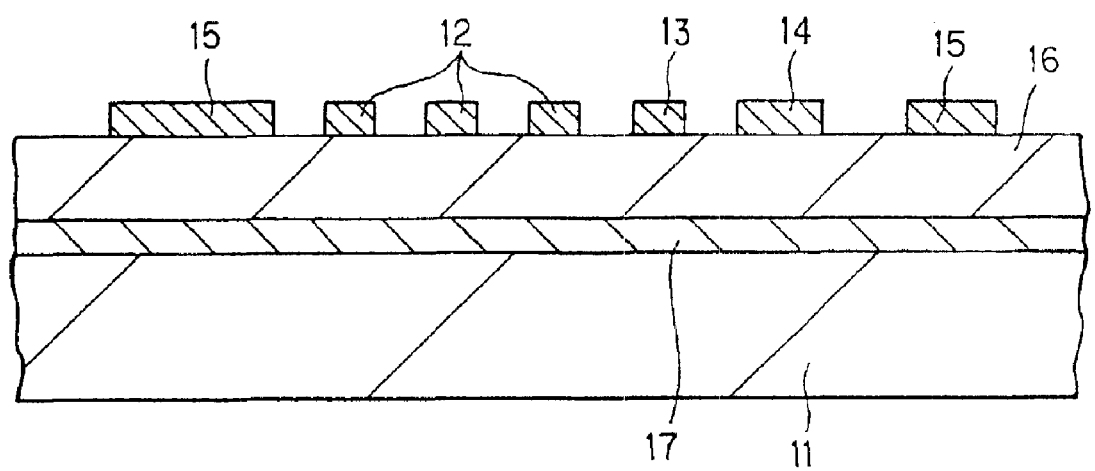
FIG. 1 is a schematic planar view showing an outlined structure of a printed wiring board according to the first preferred embodiment of the present invention.

FIG. 1 is a schematic diagram showing an outlined constitution of a printed wiring board according to the first preferred embodiment of the invention wherein reference numeral 11 designates an insulation board, 12 signal leads, 13 a control lead, 14 a power-source lead (Vdd), 15 a ground (GND) lead, 16 an insulating film (polyimide), and 17 an electromagnetic shielding film (metallic foil), respectively.

The printed wiring board according to the first preferred embodiment has a structure, as shown in FIG. 1, wherein the insulation board 11 is covered with the electromagnetic shielding film 17, the insulation board thus covered is overlaid with the insulating film (polyimide film) 16, and thereafter, leads such as signal leads 12, the control lead 13, the power-source lead (Vdd) 14, and the ground (GND) lead 15 are disposed on the insulating film 16.

A lead-joining portion for joining leads such as semiconductors is disposed on a wiring section including the printed wiring board wherein the signal leads 12, the control lead 13, the power-source lead (Vdd) 14, and the ground wiring section (GND) 15 are provided on the insulation board 11. A plurality of signal leads 12 and the control lead 13 are disposed between the power-source lead (Vdd) 14 and the ground wiring section (GND) 15. A package containing, for example, a semiconductor chip (LSI of DRAM) is electrically joined to the lead-joining portion. The lead-joining portion is formed by such a manner that an insulating film such as photosensitive polyimide is applied on the wiring section, each cavity having a predetermined dimension is defined thereon in accordance with a photographic etching technique, and the wiring section (copper foil; 18 μm) thus prepared is plated in accordance with, for example, Sn plating (1 to 10 μm) or the like.

Figure 2:
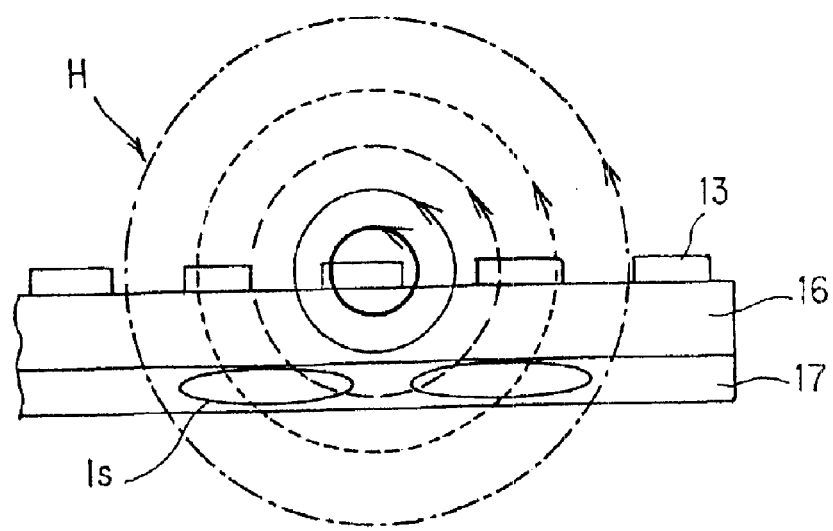
FIG. 2 is a view for explaining action of the printed wiring board according to the first preferred embodiment.
Figure 3:
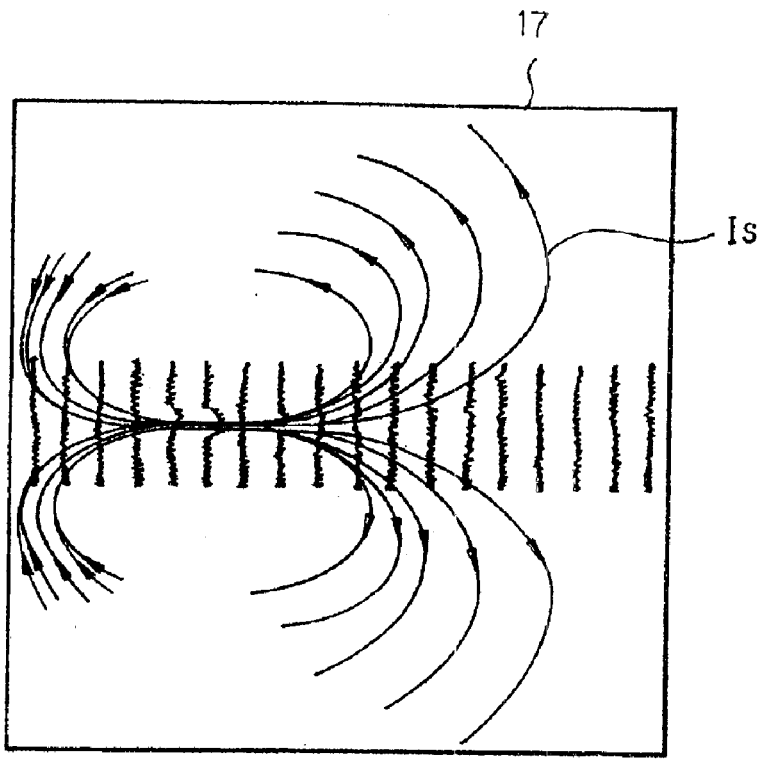
FIG. 3 is another view for explaining action of the printed wiring board according to the first preferred embodiment.

FIG. 2 is a schematic sectional view showing a current flowing through the wiring section shown in FIG. 1, a magnetic field generated around the wiring section, and an eddy current generated by the magnetic field, and FIG. 3 is a planar view showing an eddy current appeared on the electromagnetic shielding film 17 of FIG. 2 wherein reference character H designates a magnetic field, and Is denotes an eddy current.

In the printed wiring board of the first preferred embodiment, a magnetic circuit (magnetic field H) indicated by an arrow is formed so as to envelop the wiring section by the current flowing through the same as shown in FIG. 2, so that magnetic flux having a magnetic flux density which corresponds to a permeability (relative permeability=1.0 is adopted in the case where no ferromagnetic material exists in environs) responding to the electromagnetic shielding film 17 arise. The eddy current Is appears on the electromagnetic shielding film 17 along the direction in which the magnetic flux is canceled to serve action for reducing the magnetic flux density.

There is the following relationship among a signal current flowing through the wiring section including the signal leads 12, the control leads 13, the power-source lead (Vdd) 14, the ground (GND) 15 and the like; the number of magnetic flux generated in environs; and an eddy current Is appeared on the electromagnetic shielding film 17:

$$Is \propto \sigma \times d\phi/dt \tag{1}$$

where Is is an eddy current, σ is an electric conductivity (1/a specific resistance ρ [μΩ.cm]), φ is the number of magnetic flux (=∫∫B·nds=μ₀∫∫B·nds), B is a magnetic flux density, n is unit vector in the normal line, H is a magnetic field (∫cH·ds=I), and I is a signal current flowing through a wiring line. In these circumstances, the eddy current Is reduces a magnetic flux density of the magnetic flux shown by the arrow, the reduction in the magnetic flux density results in decrease in an inductance, and it brings about a reason for reducing also an inductive noise appeared as a result of interlinking of a magnetic flux.

In accordance with a relational expression of the above formula (1), the following characteristic properties (a) to (d) become apparent.

Figure 4:
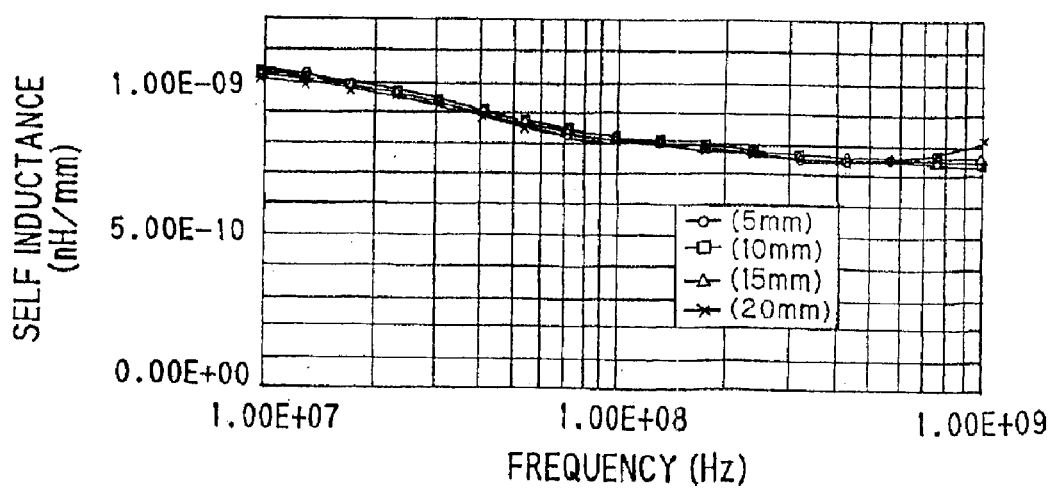
FIG. 4 is a diagram showing a flowing state of an eddy current which was confirmed by simulating specifically a self inductance reduced by the eddy current produced in a metallic foil of the printed wiring board according to the first preferred embodiment.

(a) There is not required for setting a particular value of potential so far as the electromagnetic shielding film 17 is close to the leads, so that an eddy current effect can be obtained by merely setting the electromagnetic shielding film to be close to the leads. FIG. 4 shows results confirmed specifically by a computer simulation of a self inductance of signal leads, a control lead and the like which is reduced by an eddy current appeared in the electromagnetic shielding film 17.

Heretofore, there was necessity to set a potential of the electromagnetic shielding film 17 at a predetermined value such as a ground potential or a power source-voltage in order to flow a return current of the current flowing through the signal leads 12. A conventional method has utilized a fact to the effect that an effective inductance to which a mutual inductance has been also added decreases seemingly based on the such result that a flowing direction of the return current becomes opposite to that of a current flowing through the signal leads 12. While an effect for decreasing an effective inductance caused by return current has been expected by the conventional technology, an effect for decreasing a self inductance caused by an eddy current, so that their ways of thinking differ from one another. Accordingly, it may be arranged in such that a suitable potential is selected to the electromagnetic shielding film 17, or no setting of such a particular value of potential is necessary in the present invention.

Figure 5:
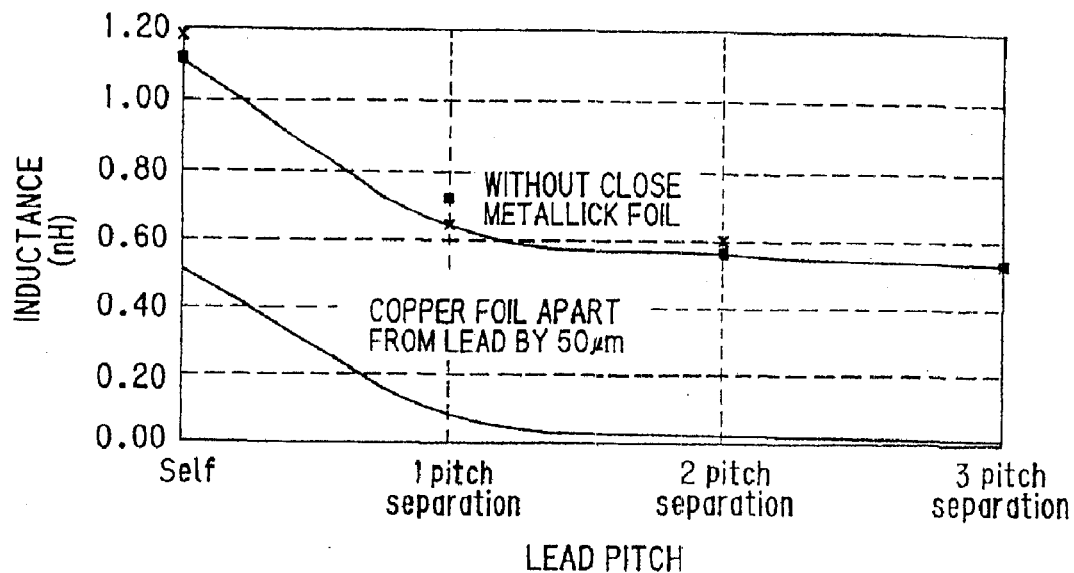
FIG. 5 is a diagram showing a change in an inductance (measured values at 100 MHz) with or without a metallic foil in the printed wiring board according to the first preferred embodiment.

(b) Advantageous effects increase with decrease of an interval defined between the electromagnetic shielding film 17 and the signal leads 12 (see FIG. 4). FIG. 5 is a graphical representation indicating a relationship between changes in an inductance measured (at 100 MHz) for both the case where the electromagnetic shielding film 17 to be used for decreasing the distance exists and the case where the electromagnetic shielding film does not exist and changes in a mutual inductance in response to a value of lead pitch.

(c) Advantageous effects appear with increase in a frequency (see FIG. 4).

Figure 6:
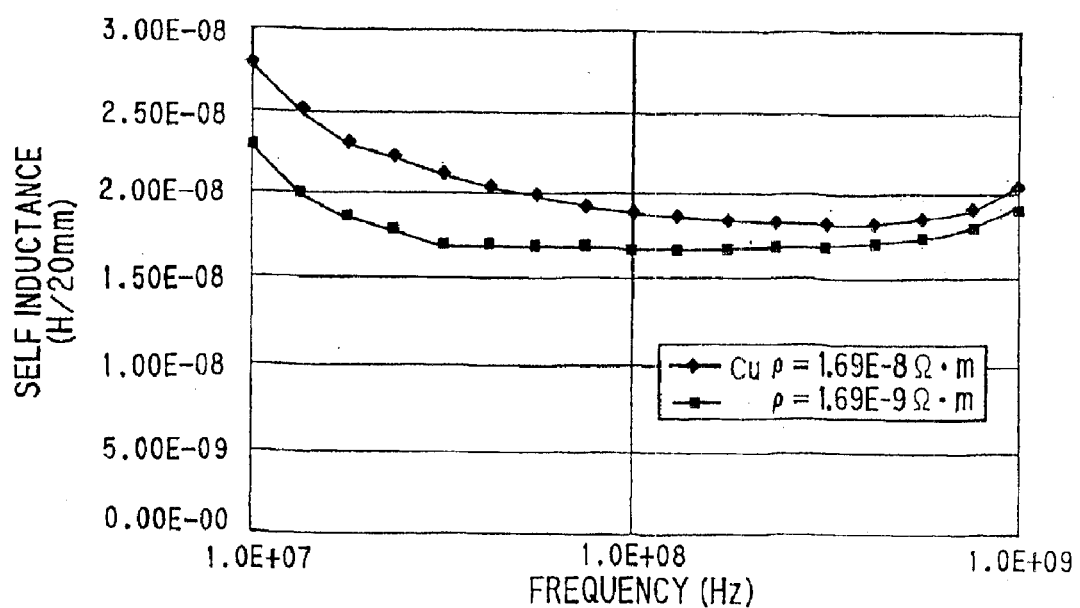
FIG. 6 is a diagram showing a change due to a value of specific resistance of a metallic foil in the printed wiring board according to the first preferred embodiment and a frequency of a self inductance.

(d) Effects for reducing an inductance caused by an eddy current increase with an electrical conductivity of the electromagnetic shielding film 17. FIG. 6 is a graphical representation indicating changes in a value of specific resistance of the electromagnetic shielding film 17 due to a frequency of a self inductance.

In order to obtain effectively such advantageous effects, wiring lines should be prepared from the following materials.

(1) A material of the electromagnetic shielding film 17 is to be selected from a material having a high conductivity such as copper, aluminum, gold, silver, and chromium; or an alloy containing any of these metals as the major component. A volume specific resistance of such material should be 30 μΩ·cm or less.

(2) A distance defined between a wiring line and the electromagnetic shielding film 17 to be reduced is 150 μm or less. For the sake of achieving effects for decreasing a magnetic flux due to an eddy current, the interval to be reduced must be restricted. In this respect, although it is preferred that the interval is made to be 50 μm or less, the maximum thickness 150 μm is selected as the maximum interval to be reduced with taking a dielectric layer thickness of an objective TAB tape carrier into consideration in this case.

(3) A supposed frequency corresponds to that used in a high bit rate transmission line for digital circuit. Namely, it is necessary to transmit a digital signal with a clock signal suited for the internal circuits of a MPU (Micro Processing Unit) on a circuit board for connecting an ASIC (Application Specific Integrated Circuit) with a DRAM (Dynamic Random Access Memory) chip, a board for connecting a MPU with a semiconductor chip set, and a data bus for connecting external terminals of a semiconductor chip in a package with lead terminals. It becomes necessary for data transmission of 100 MHz to 1 GHz in terms of clock frequency. As a result, an objective range extends from around 10 MHz to 15 GHz in sinusoidal frequency. Since effects for decreasing a magnetic flux cannot be so expected due to an eddy current below the above-mentioned frequency, such region is excluded from the objective range. The undermentioned relationship exists between a clock frequency and a sinusoidal frequency, and a rise-up portion or a fall-down portion of the clock signal relates closely to noise generation. The waveform of this portion is analyzed into sinusoidal signal components by Fourier expansion, and a sinusoidal component with the maximum amplitude is regarded as the fundamental component. The aforementioned frequency range is set up by taking the fifteenth harmonic thereof into consideration at the maximum.

(The Second Preferred Embodiment)

Figure 7:
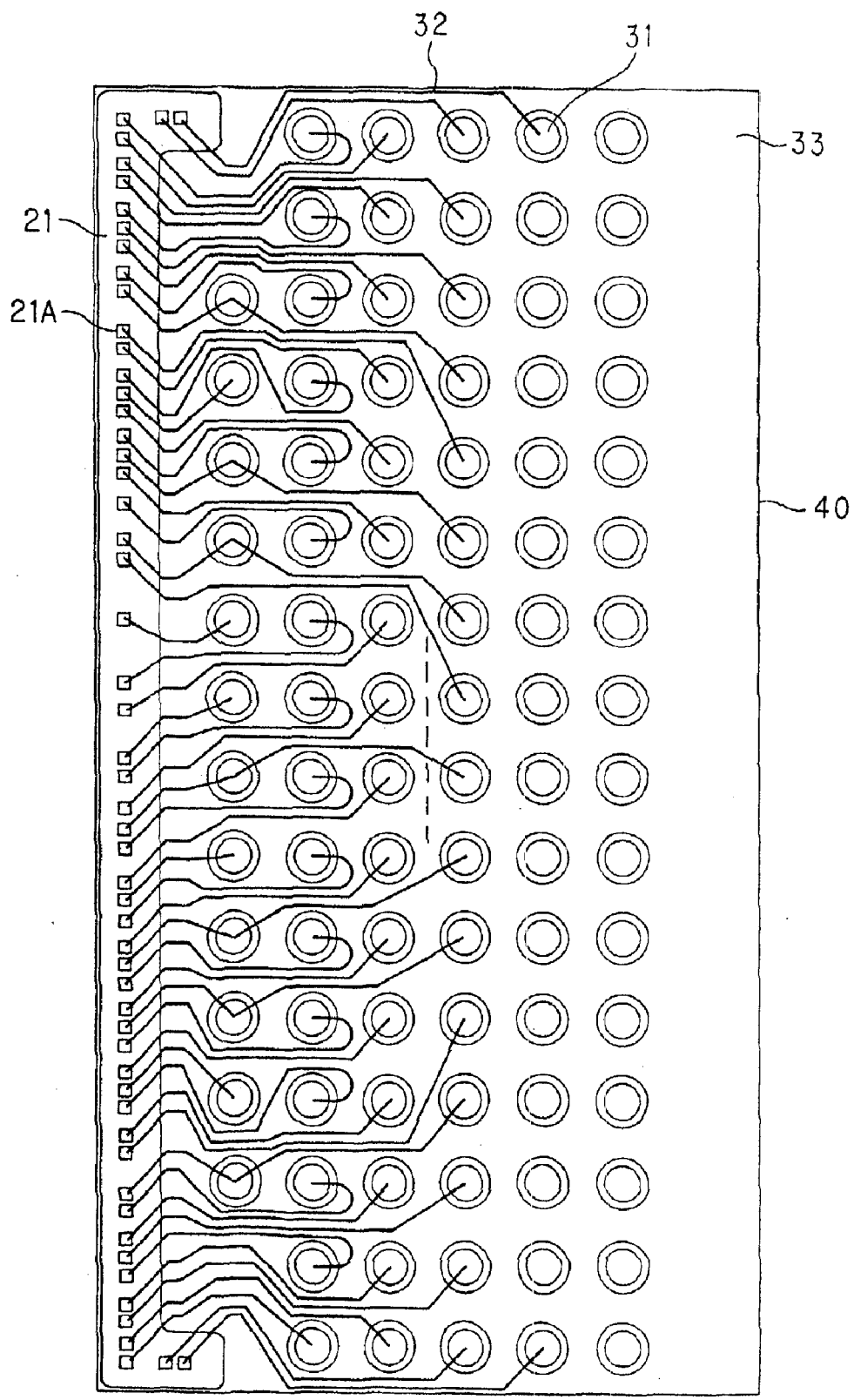
FIG. 7 is a schematic planar view showing an outlined structure of a DRAM having a BGA constitution of CSP type in an LOC structure according to the second preferred embodiment.
Figure 8:
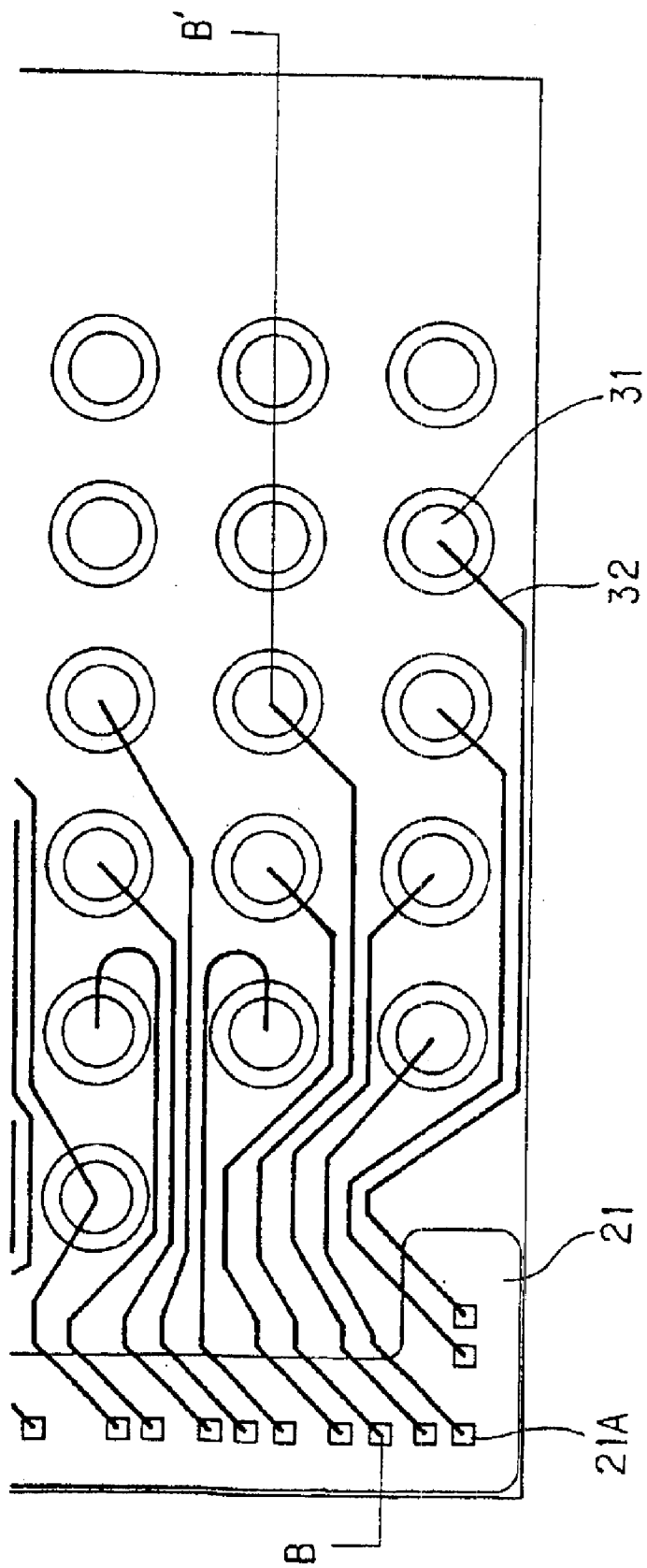
FIG. 8 is an enlarged view showing the essential part of FIG. 7.
Figure 9:
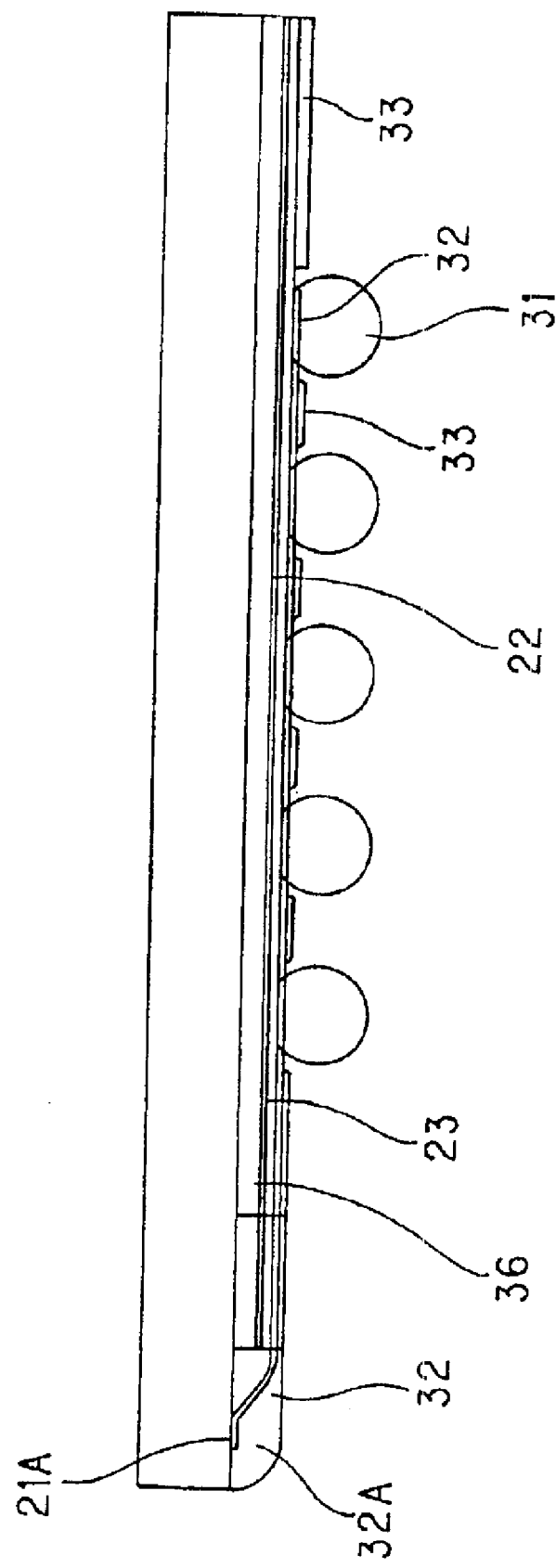
FIG. 9 is a sectional view taken along the line B–B' of FIG. 8.
Figure 10:
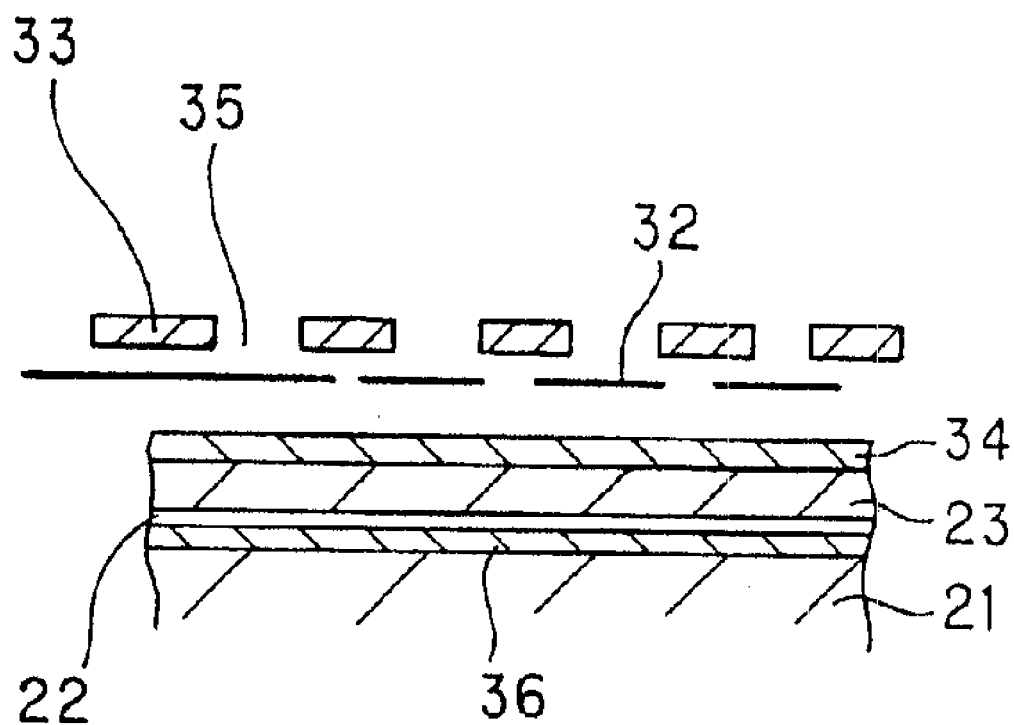
FIG. 10 is a developed sectional view showing a detailed constitution of the structure for preventing electromagnetic wave shown in FIG. 9

FIG. 7 is a schematic planar view showing an outlined constitution of a DRAM having BGA structure of CSP type according to the second preferred embodiment of the invention, FIG. 8 is an enlarged view showing the essential part of FIG. 7, FIG. 9 is a sectional view taken along the line B–B' of FIG. 8, and FIG. 10 is a developed sectional view showing a detailed constitution of the electromagnetic shielding structure shown in FIG. 9. In FIGS. 7 to 10, inclusive, reference numeral 21 designates a semiconductor chip, 21A an external electrode (bonding pad) for the semiconductor chip 21, 22 an electromagnetic shielding film, 23 an insulating film (polyimide film), 31 a solder ball, 32 leads (copper foil wiring) in a package having BGA structure of CSP type, 33 a polyimide film (insulating film) after having worked a cavity for mounting solder ball, 34 an adhesive of epoxy or the like base resin, 35 a cavity for mounting solder ball, and 36 a thermoplastic adhesive prepared from thermoplastic polyimide or B-stage epoxy, respectively.

A DRAM having BGA structure of CSP type according to the second preferred embodiment of the invention is a micro BGA package used in a high-speed memory wherein an external terminal of the semiconductor chip 21 is disposed on either side of the semiconductor chip 21 as shown in FIGS. 7 to 10. The external electrode (bonding pad) 21A on the principal plane of the semiconductor chip 21 is disposed along a chip end of the principal plane of the semiconductor chip 21. As shown in FIGS. 8 and 9, the electromagnetic shielding film (metallic foil) 22 is disposed on a region other than that on which the external electrode 21A has been placed through the thermoplastic adhesive 36, and the insulating film (polyimide film) 23 is overlaid thereon. The leads 32 for signal and power source/Gnd are placed on the insulating film 23 through the adhesive 34 prepared from an epoxy-base resin and the like. A terminal portion 32A of the lead 32 is electrically connected to the external electrode (bonding pad) 21A on the principal plane of the semiconductor chip 21.

The polyimide film (insulating film 33) after having worked cavity for mounting solder ball is bonded to a wiring section containing the leads 32 by means of the adhesive 34, so that the solder ball 31 is positioned in the cavity for mounting solder ball 35.

Figure 11A:
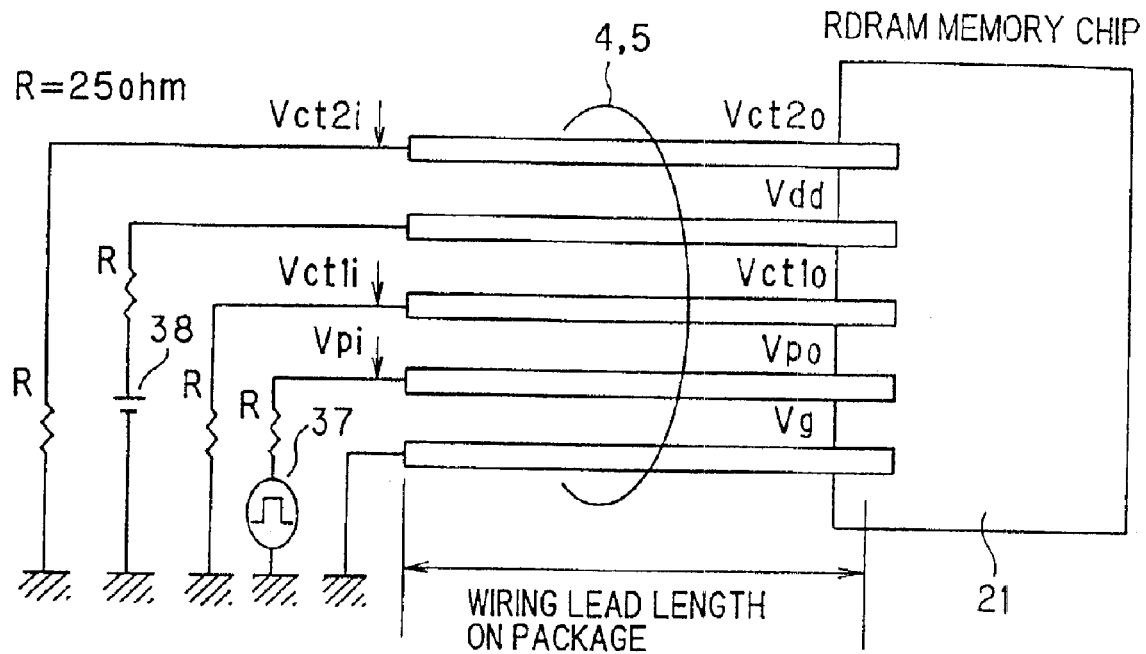
FIGS. 11(a) and (b) are diagrams each showing a condition for confirming noise affecting wiring leads on a package of a DRAM having a BGA structure of CSP type according to the second preferred embodiment in accordance with a specific simulation.
Figure 11B:
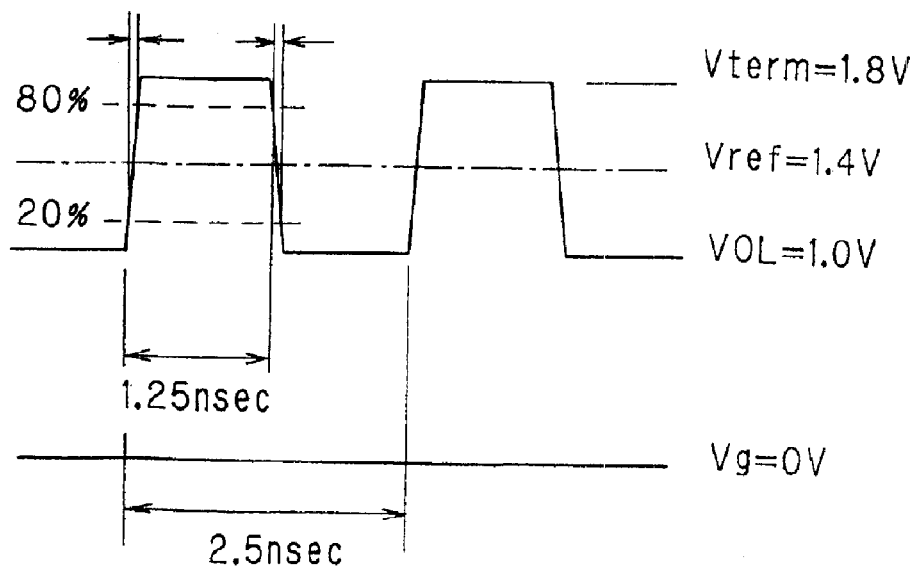
Figure 12:
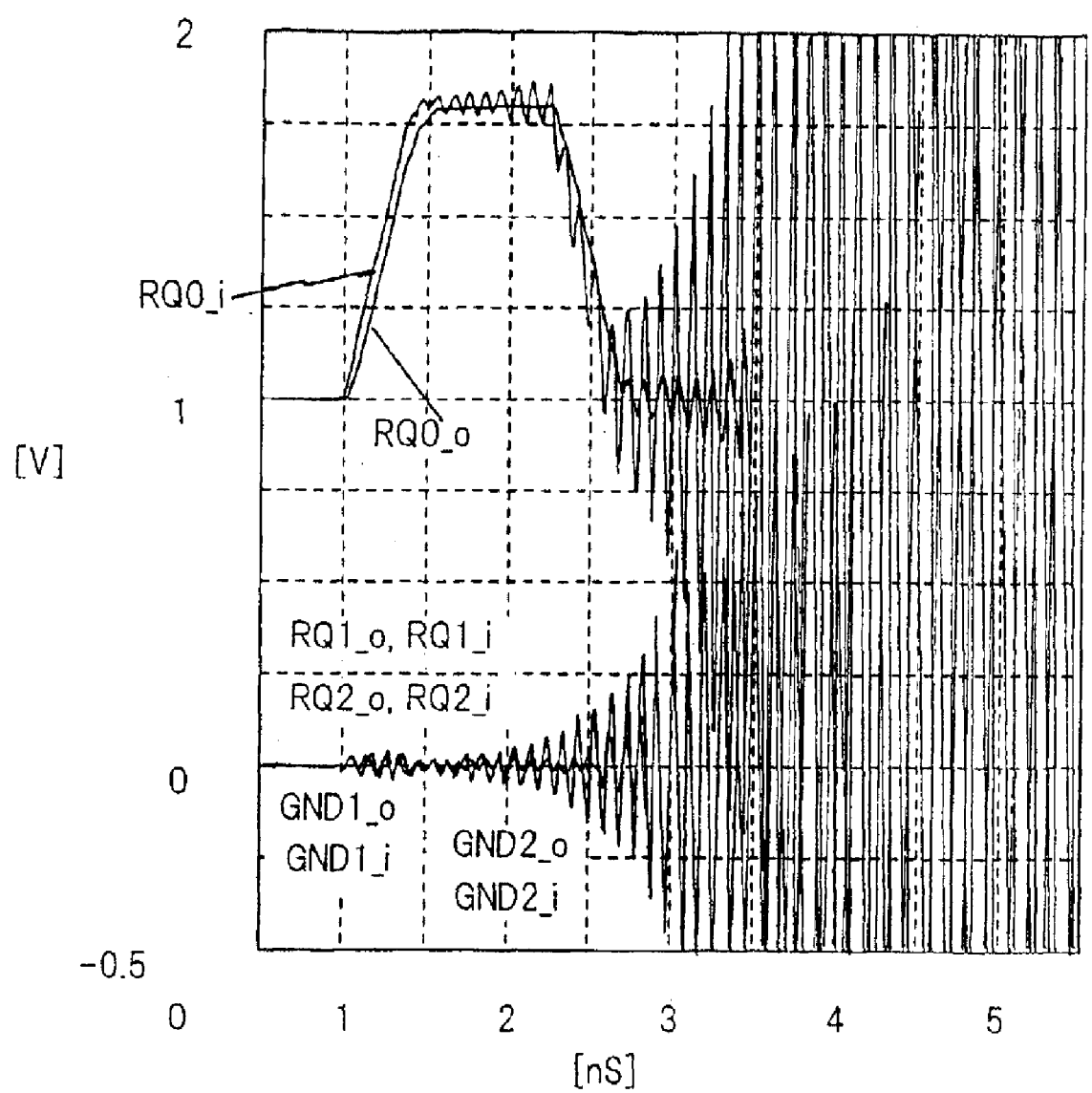
FIG. 12 is a diagram showing results of a simulation (a) in case of a lead interval as shown in FIG. 11.
Figure 13:
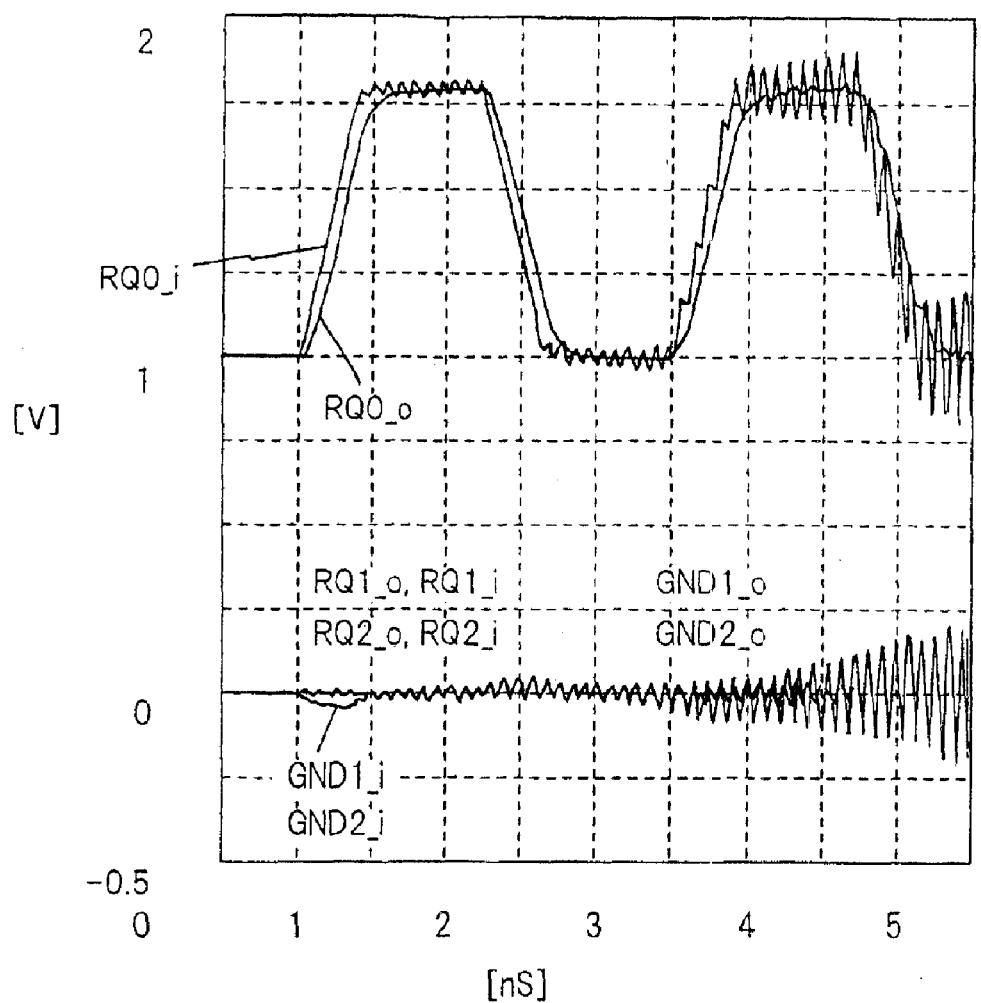
FIG. 13 is a diagram showing results of a simulation (b) in the case where a narrow portion of a lead is set to 150 µm in FIG. 11.
Figure 14:
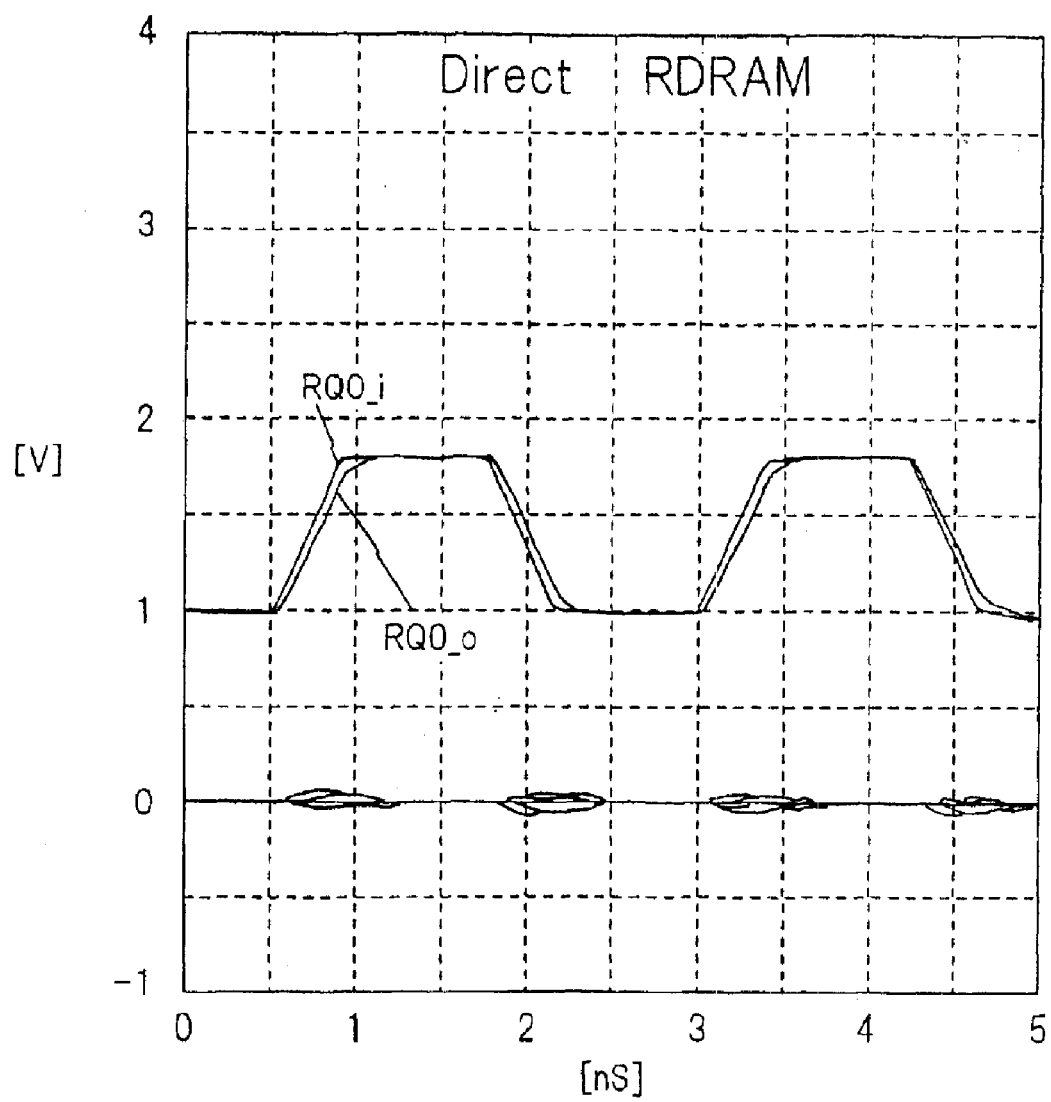
FIG. 14 is a diagram showing results of a simulation (c) in the case where calculation is effected on a disposition of an electromagnetic shielding film.

Since the wiring section of FIG. 7 is finely wired by means of a TAB tape, an interval defined between the closest leads is set to 40 μm. When the clock pulse shown in FIG. 11 is transmitted to the wiring section without applying the electromagnetic shielding film, the pulse waveform to be transmitted falls into disorder to cause ringing (resonance) as shown in FIG. 12. When an interval defined between leads is broadened, a degree of the ringing is moderated as shown in FIG. 13. However, fine wiring by means of a suitable TAB tape must be traded off for moderating such ringing. It is also contrary to a purpose for downsizing package. From the data shown in FIG. 14, a waveform of pulses transmitted, and a state where a cross talk noise to leads to be positioned to reduce an interval between them arises provided that the electromagnetic shielding film is applied while maintaining the wiring of FIG. 7 are confirmed. It is understood therefrom that the ringing decreases so that a waveform containing very a low noise was obtained.

Energy of the pulse wave transmitting through a wiring lead propagates to the adjacent wiring lead in the form of magnetic energy. The magnetic energy is once stored in an electrostatic capacity formed between the leads in the form of electrostatic energy, and the energy thus stored propagates to the adjacent wiring lead in the form of magnetic energy in the case when the energy stored is redischarged. Since energy propagates by changing alternately the form of energy between magnetic energy and electrostatic energy as described above, a condition of ringing is formed, when only the form of energy changes at the same position. An oscillation frequency f in this case is determined from an effective inductance L and a value of an electrostatic capacity C storing electrostatic energy in accordance with the following equation (2).

$$f = 1/2\pi\sqrt{LC} \qquad (2)$$

Figure 15A:
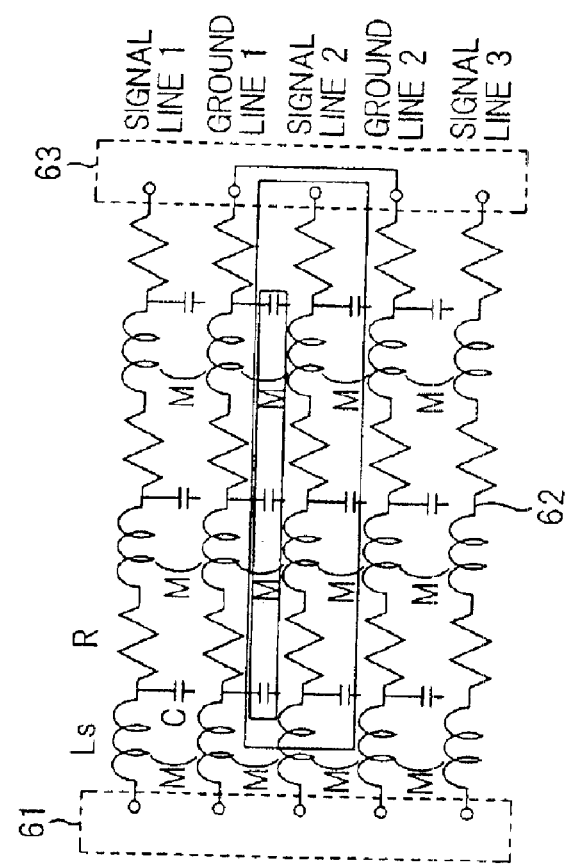
FIG. 15 is a view represented by an equivalent circuit for explaining action in a ringing portion due to a mutual inductance.
Figure 15B:
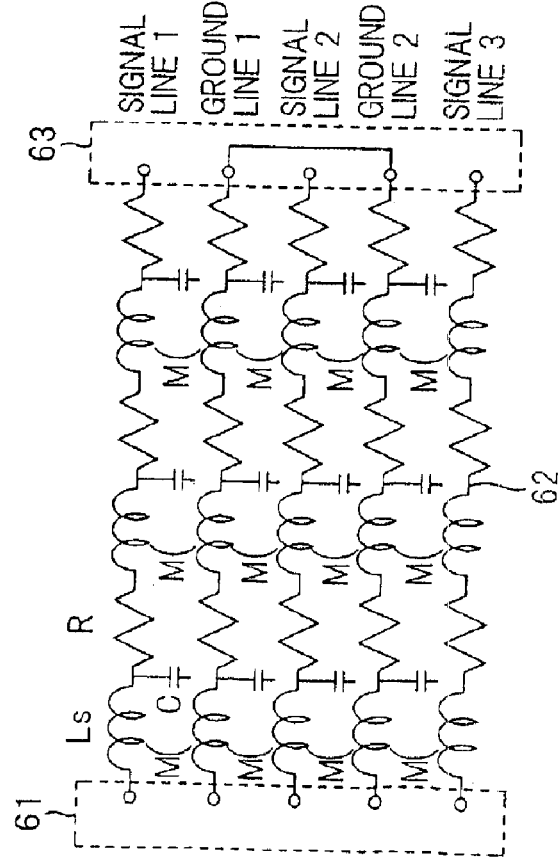

In general, energy is consumed due to a resistance loss and the like in the course of the energy conversion, so that if energy consumption is remarkable with respect to energy supplied, ringing decreases. When an existing resistance has a low value, a resistance loss is slight, so that such a condition that energy is continuously supplied from the pulses transmitting through a wiring lead is established. Accordingly, such energy conversion is continually performed to cause oscillation. FIG. 15(a) indicates that the above-mentioned relationship has been established by only the wiring section of a package by means of an equivalent circuit wherein reference numeral 61 designates a joining portion of the terminal of a semiconductor chip with the wiring of a package, 62 the wiring for the package, 63 a joining portion of the package wiring with a printed circuit board, Ls a self inductance, M a mutual inductance between leads of the package, and C an electrostatic capacity between the leads of the package, respectively. With respect to grounded-circuits, even the ones which have been wired independently in each package section, they are shorted on the common plate-like ground layer (GND) in such stage that they are connected to a printed circuit board through solder balls. FIG. 15(b) shows a ladder type equivalent circuit in the case where components have been assembled by adding the condition involved in a printed circuit board. As a matter of course, even in a grounded-circuit being in a shorted state wherein components are connected to a common plate-like ground layer through solder balls, since the resistance at a position being in a shorted state is very low, energy which is continuously supplied cannot be consumed by only a resistance loss in this portion. Although there is no means like a common plate-like ground layer for a printed circuit board as in grounded-circuit in case of signal leads, control leads, and power-source leads, a loop is formed between the adjacent leads through a mutual inductance M between the leads as well as an electrostatic capacity existing between leads as shown in FIG. 15(b), whereby a condition for flowing a current through the loop is formed. A possible resistance component is merely a resistance in the wiring section of a package, so that lesser energy consumption than that of a grounded-circuit is observed. In this loop section, an LC circuit consisting of a self inductance Ls in a lead, a mutual inductance M between leads, and an electrostatic capacity C between leads is merely composed. Accordingly, when it is in the vicinity of frequency represented by the equation (2), an oscillation condition is easily in good order. In this case, since a resistance loss cannot be expected, there is no means to suppress an oscillation other than that wherein energy supplied through a mutual inductance M is controlled. The case where there is shown a measure to meet the situation in which an interval defined between leads has been broadened corresponds to the results illustrated in FIG. 13. In this case, however, the selected measure is the one contrary to a realization of fine wiring. The results obtained by reducing the mutual inductance M by a measure which is not contrary to fine wiring are the ones shown in FIG. 14, and the measure is the one wherein an electromagnetic shielding film is provided. While a loop current appears also on an electromagnetic shielding film (metallic foil), since electrostatic energy stored in the loop exhibits such a degree being negligible in addition to such fact that an inductance component is remarkably low in this case, energy supplied is consumed as an eddy current loss appearing due to a relation with a conductivity of the electromagnetic shielding film (metallic foil). It is difficult to consider that an oscillation due to eddy current components exists in this case.

As is apparent from the above description, according to the first preferred embodiment, an eddy current flows on the electromagnetic shielding film 17 which has been placed at a position close to a wiring section in a direction along which a magnetic flux generated by a current flowing through the wiring section (leads) of a package is canceled. Thus, inductances (self inductance and mutual inductance between leads) of the wiring section and inductive cross talk can be reduced. As a result, a possibility of speeding up for signal transmission maybe expected.

While the second preferred embodiment has been described with respect to the case wherein a position of a chip terminal extends along chip ends, such a modification wherein a chip terminal is positioned at the central portion of the chip may be applied, whereby signal solder balls are separately disposed from a power source/GND solder balls in opposite to each other may be applied. Accordingly, the present invention is not limited to the second preferred embodiment. In other words, an ordinary arrangement of solder balls for DRAM having BGA structure of CSP type is applicable.

When the electrostatic shielding film (metallic foil) 22 is disposed between the lead 32 and the semiconductor 1 through the insulating film 23, it is possible to prevent from influence affected by an electromagnetic wave which is to be given to the semiconductor chip 21. Thus, it is possible to reduce a noise which is to be added to a driving voltage or signals such as clock signals in a transmission path. Furthermore, when the electromagnetic shielding film (metallic foil) 22 is provided at a position close to signal leads, it is possible to reduce an inductance of the signal leads, whereby a transmission rate in signal, data and the like can be increased, and as a result, speeding-up of a driving speed of a device can be intended.

An example of an arrangement for solder ball terminals in a BGA package of CSP type according to the second preferred embodiment is shown in Table 1.

TABLE 1

EXAMPLE OF ARRANGEMENT OF BALL TERMINALS OF CSP TYPE-BGA PACKAGE

| COLUMN NUMBER OF JOINING PORTION OF CHIP TERMINAL | COLUMN 1 | COLUMN 2 | COLUMN 3 | COLUMN 4 | COLUMN 5 |
|---|---|---|---|---|---|
| 1 | | | | | S101 |
| 2 | | | | S100 | |
| 3 | | GND | | | |
| 4 | | | DQB8 | | |
| 5 | | | | GND | |
| 6 | | | DQB7 | | |
| 7 | | DQB6 | | | |
| 8 | | | | VDD | |
| 9 | | | DQB5 | | |
| 10 | | DQB4 | | | |
| 11 | GND | | | GND | |
| 12 | | | | VTRM | |
| 13 | | | DQB3 | | |
| 14 | | DQB2 | | | |
| 15 | VDD | | | | |
| 16 | | | DQB1 | | |
| 17 | | DQB0 | | | |
| 18 | GND | | | GND | |
| 19 | | | RQ0 | | |
| 20 | | RQ1 | | | |
| 21 | GND | | | GND | |
| 22 | | | RQ2 | | |
| 23 | | RQ3 | | | |
| 24 | VDD | | | GND | |
| 25 | | | RQ4 | | |
| 26 | | RQ5 | | | |
| 27 | GND | | | | |
| 28 | VDD | | | | |
| 29 | | RQ7 | | | |
| 30 | | | RQ6 | | |
| 31 | | | | VDDA | |
| 32 | VREF | | | | |
| 33 | | CTMN | | | |
| 34 | | | CTM | | |
| 35 | GNDA | | | GNDA | |
| 36 | | CFMN | | | |
| 37 | | | CFM | | |
| 38 | GND | | | GND | |
| 39 | | DQA0 | | | |
| 40 | | | DQA1 | | |
| 41 | VDD | | | | |
| 42 | | DQA2 | | | |
| 43 | | | DQA3 | | |
| 44 | | | | VTRM | |
| 45 | GND | | | GND | |
| 46 | | DQA4 | | | |
| 47 | | | DQA5 | | |
| 48 | | | | VDD | |
| 49 | | DQA6 | | | |
| 50 | | | DQA7 | | |
| 51 | | | | GND | |
| 52 | | | DQA8 | | |
| 53 | | GND | | | |
| 54 | | | | GND | |
| 55 | | | | | SCK |

(Third Preferred Embodiment)

A semiconductor device wherein a TAB tape according to the third preferred embodiment is the one in which a wiring surface of the TAB tape has been set on the side of a semiconductor chip 41. More specifically, a structural body composed of a plurality of layers of an insulating film with a thermoplastic adhesive 43/an electromagnetic shielding film 42/an insulating film 44 is employed in this case. Each thickness of the insulating films 43 and 44 of the structural body of plural layers is selected from a range of 25 $\mu$m to 100 μm, while a thickness of the electromagnetic shielding film 42 is set to be from 18 μm to 50 μm. Although 75 μm thickness of the insulating films 43 and 44 has been typically adopted, it is better to make thinner the insulating film as much as possible to obtain eddy current effects (electromagnetic shielding effects) due to an electromagnetic shielding film 47 in the present invention. In the preferred embodiment of FIG. 16(*a*), since there is a balance with insulating effects of the insulating films 43 and 44, a material prepared by bonding an insulating film having a thickness of from 50 μm to 100 μm onto both sides of the electromagnetic shielding film 42 is used, the resulting structural body of plural layers is bonded to a TAB tape, and the semiconductor chip 41 is mounted thereon to form a composite material. A solder ball 48 is disposed on the opposite surface of the semiconductor chip 41 to obtain an assembly of BGA structure.

Figure 16A:
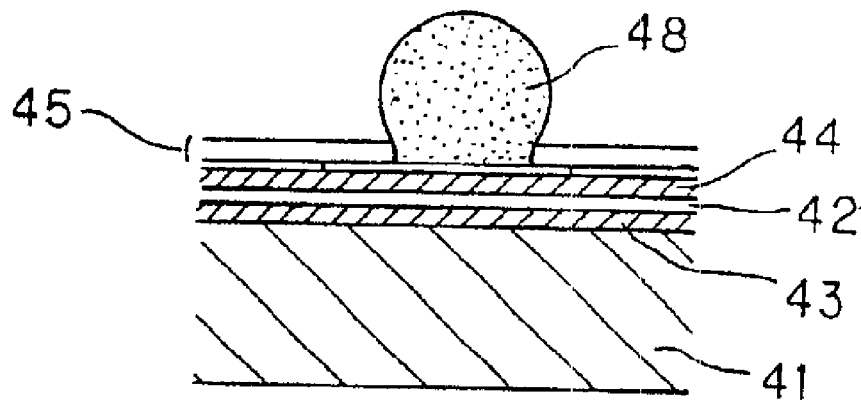
FIGS. 16(a) and (b) are schematic planar views each showing an outlined structure of an essential part of an electronic device according to the third preferred embodiment of the invention.
Figure 16B:
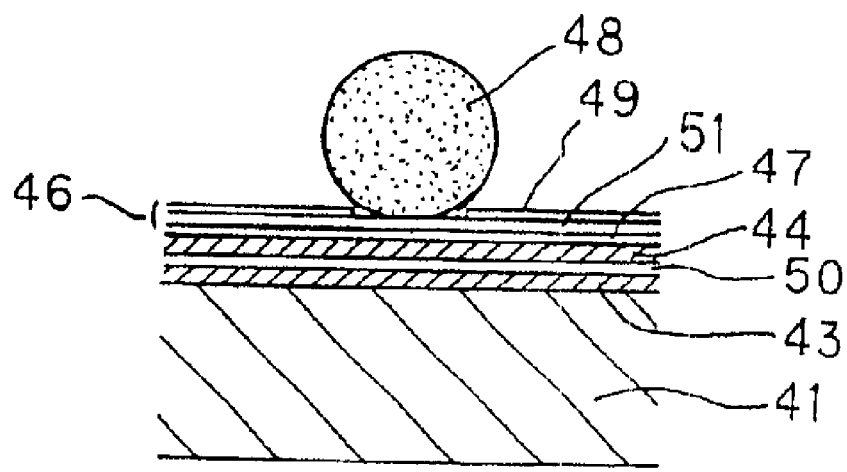

Furthermore, another semiconductor device wherein a TAB tape according to the third preferred embodiment is the one in which the wiring surface of the TAB tape is set to the side of a solder ball as shown in FIG. 16(*b*). While a measure to use a material wherein an electromagnetic shielding film (silver foil) has been provided on the core of an insulating material may also be considered as in FIG. 16(*a*), an example of FIG. 16(*b*) is the one wherein a material of a structure on the wiring surface of which a copper foil has been backed is applied. In this case, the copper foil which has been disposed (backed) on the opposite side of the TAB tape functions as an electromagnetic shielding film. In this case, since a thickness of the TAB tape film comes to be a close distance with respect to the electromagnetic shielding film (copper foil) 47 without any modification, much more eddy current effects can be drawn by an amount corresponding to that for making thinner a thickness of the TAB tape film. An actual thickness of the TAB tape film ranges from 25 μm to 100 μm. Although a fabrication method of the structural body is substantially the same as that of the structure of FIG. 16(*a*), the surface on which a solder ball is mounted must be coated with a solder resist to protect insulation on the wiring surface. A thickness of the solder resist is sufficient to be within a range of from 20 μm to 30 μm. While it is not required to particularly restrict a thickness of the solder resist in the present invention, the solder resist is a structural material necessary for the constitution of the invention. As is apparent from the above description, the electromagnetic shielding films 42 and 47 are disposed on the surface, on which an integrated circuit of the semiconductor chips 21 and 41 have been formed, through an insulating film, and signal leads are disposed on the electromagnetic shielding films 42 and 47 through either the insulating film 44 or 51, whereby the electromagnetic shielding films 42 and 47 are placed closely to the signal leads. As a result, an inductance for the signal leads can be reduced. Thus, it is possible to increase transmission speed of signals, whereby speeding up for operational speed of a device can be achieved. Moreover, it is possible to protect influence of an electromagnetic wave affecting the semiconductor chip 41, so that it becomes possible to reduce such a possibility that a noise is added to signals such as clock signals in a driving voltage or a transmission path.

While an example wherein a printed wiring board or a TAB tape is used as a wiring board has been described with respect to the first and the third preferred embodiments, such wiring board is not limited to a printed board and a TAB tape in the present invention, so that any wiring board may be employed so far as the wiring board is the one wherein a wiring section has been disposed on an insulation board.

(The Fourth Preferred Embodiment)

Figure 19:
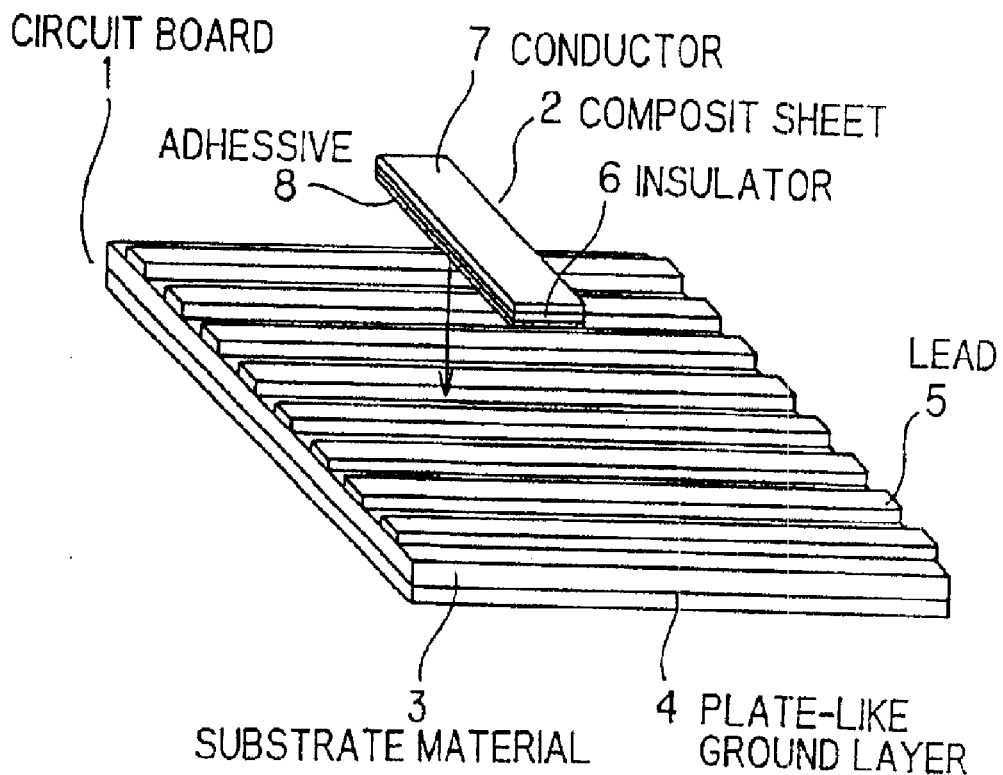
FIG. 19 is an explanatory view showing a circuit board for electronic parts according to the fourth preferred embodiment of the present invention.

In FIG. 19, reference numeral 1 designates a circuit board, and 2 denotes a composite sheet to be bonded to the circuit board 1. The circuit board 1 is composed of a substrate material 3 made of an insulating material, a plate-like ground layer 4 disposed in the substrate material 3, and a lead 5 of a predetermined pattern which is formed on the surface of the substrate material 3.

Figure 20:
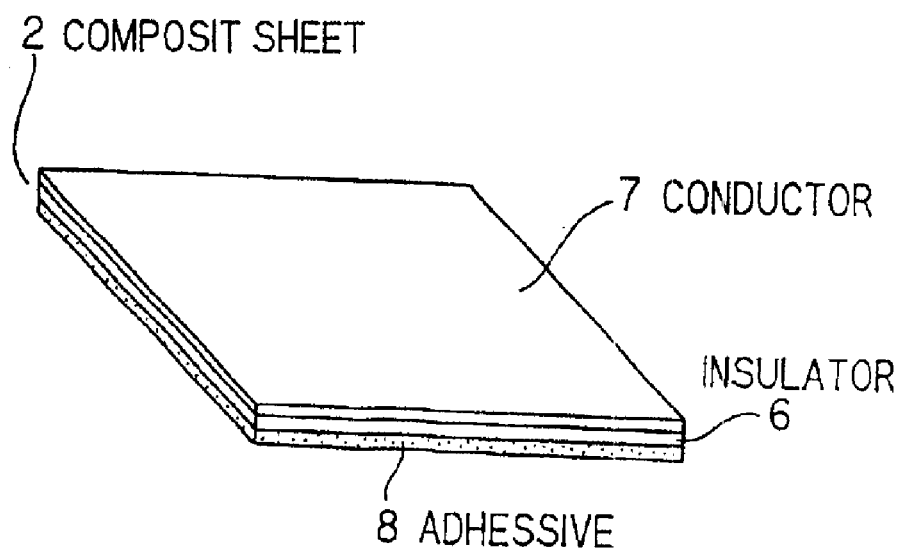
FIG. 20 is an explanatory view showing a composite sheet used in the fourth preferred embodiment shown in FIG. 19.

FIG. 20 is a view showing an enlarged structure of the composite sheet 2 which is composed of a film-like insulating material 6, a foil-like conductor 7 prepared by laminating integrally together with the insulating material 6, and an adhesive layer 8 which has been previously formed on the surface of the insulating material 6. A section of the resulting material cut off with a predetermined dimension is bonded onto the lead 5 of the circuit board 1 as the composite sheet 2 of FIG. 19 with the adhesive layer 8.

Figure 21:
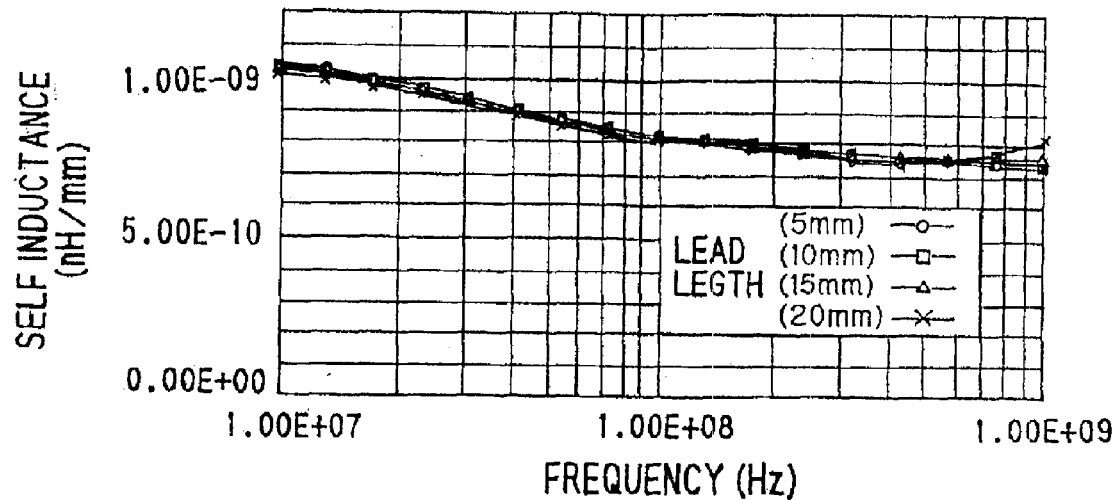
FIG. 21 is a graph showing a mutual relationship between a self inductance of a circuit board provided with a plate-like ground layer and a frequency.

FIG. 21 is a graphical representation indicating a relationship between a self inductance of the circuit board 1 containing the plate-like ground layer and a frequency of the sinusoidal current flowing through the lead 5. In the graph, a self inductance was determined with respect to the circuit board 1 in which an interval defined between the plate-like ground layer 4 and the lead 5 is 40 μm, a width of the lead 5 is 45 μm, and a length of the lead 5 is 5 to 20 mm in accordance with an electromagnetic field analysis and a circuit simulation, and the results determined are arranged as a value per unit length (1 m).

According to the graph, a self inductance of the circuit board decreases with increase of a frequency in a range of 10 MHz to 1 GHz, and it is confirmed that a self inductance at 1 GHz decreases up to ½ as compared with that of 10 MHz.

Thus, it has been found from the results stated above that a characteristic impedance is about $7Z_0$ in the case when a self inductance is $0.5\ L_0$ in accordance with the following relational expression (4):

$$Z=\sqrt{L/C}=\sqrt{n^*L_0/C}=N^*Z_0 \quad (4)$$

$$N=\sqrt{n}$$

$$Z_0=\sqrt{L_0/C}$$

Namely, the result means that the characteristic impedance is reduced by about 30% in a frequency range of 10 MHz to 1 GHz.

Figure 22:
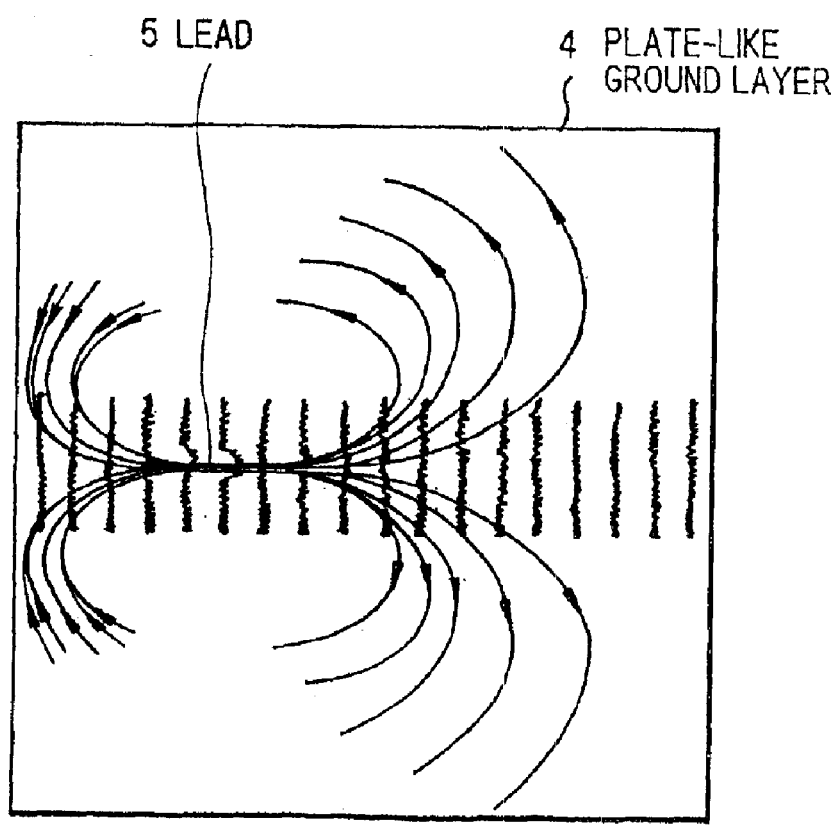
FIG. 22 is a diagram showing an eddy current appearing on a conductor disposed close to a lead section.

FIG. 22 is a diagram showing an eddy current flowing through the plate-like ground layer 4 by means of an electric current flowing through the lead 5 wherein the eddy current is generated in a direction in which a magnetic flux produced by the current flowing through the lead 5 is canceled, whereby the self inductance of a circuit board is reduced as mentioned above, and as a result, characteristic impedance of the circuit board decreases.

The present invention utilizes the same effects as that for reducing a self inductance by means of the plate-like ground layer 4 as described above in which the composite sheet 2 is bonded to the circuit board 1 to produce an eddy current on the conductor 7 of the composite sheet 2, whereby a magnetic flux generated by a current flowing through the lead 5 of the circuit board 1 is canceled, so that the self inductance of the circuit board 1 is reduced to decrease characteristic impedance.

Such reduction in characteristic impedance corresponds to characteristic adjustment with respect to the circuit board. Accordingly, the characteristic adjustment is possible up to around 30% as is apparent from the above description.

A sinusoidal frequency region of 10 MHz to several GHz (corresponding to 50 MHz to several GHz in case of clock frequency in a digital circuit) is selected as a frequency to be applied.

In order to produce a high eddy current in the conductor 7 of the composite sheet 2, it is desired that a spacing defined between the conductor 7 of the composite sheet 2 and the lead 5 of the circuit board 1 is set at a small value as less as possible. For this reason, it is desirable that a total thickness of the insulating material 6 of the composite sheet 2 and the adhesive layer 8 formed thereon is set to 100 μm thickness at the maximum for the sake of holding positively a prescribed eddy current.

On the other hand, the lower limit of the total thickness must be set to 10 μm thickness in order to maintain its strength.

In the adjustment for characteristic impedance as described above, it becomes possible to incorporate continuously such adjusting operation into a flow of its working processes in accordance with such a manner that first, a typical sample is selected to adjust the same, and then a position at which a composite sheet is to be bonded is decided on the basis of the sample. Accordingly, it is possible to provide a circuit board for electronic parts the characteristic impedance of which is easily adjusted even in a digital circuit which is fabricated with an extraordinarily large number.

As mentioned above, according to the circuit board for electronic parts of the present invention, a composite sheet composed of a laminate of an insulating material and a conductor is bonded onto a lead in the circuit board in such that the insulating material is positioned on the lead side of the circuit board, whereby characteristic impedance of the circuit board is adjusted. Therefore, a procedure for adjustment is simple, besides the adjustment can be conducted easily even in case of adjusting a large number of digital circuits as mentioned hereinbefore.

Although the present invention has been described specifically on the basis of the above described preferred embodiments, the invention is not limited to the first, second, third, and fourth embodiments mentioned above, a variety of modifications may be, of course, applied within a range wherein the subject matter of the invention does not depart therefrom.

In the following, a cause for generating a noise in a region of high frequency will be described. As shown in FIG. 17 (one for explaining a cause for generating a noise in a high frequency region), the following four types of causes for generating a noise in a high frequency region are considered. It is considered that there are causes for requiring a study or those for not requiring such study dependent upon a situation of circuits. In FIG. 17, reference numeral 39 designates an example of a transistor circuit in a semiconductor chip.

(A) Variation in Power-Source Potential, Variation in Ground Potential

With respect to a variation, particularly a variation in a ground potential, there has heretofore been circumstances which had been studied with a discrimination from a variation in power-source potential being called "ground bouncing". This is because a margin for a potential variation is stricter on a ground side than that of a power-source side. However, such variation means essentially a potential variation appeared based on the same theory as described hereinafter.

In the case when electric currents passing through some lines flow into the same power-source circuit or the same circuit, a potential at a terminal of a semiconductor chip 40 is changed by the one which is determined due to inductance components in the lines and values of currents flowing into and out from the lines which is not an essential power-source potential or a ground potential. As a countermeasure, the following measures may be considered.

(1) Power circuits and ground circuits are made to be multiple to disperse electric currents flowing into and out from the circuits in such that they are not concentrated into a particular circuit.

(2) Each inductance in the power-source circuit and the ground circuit must be controlled in a decreased state. As a manner for decreasing such inductance, such an effect that an electromagnetic shielding film such as a copper foil (metallic film) 22 is disposed closely to the circuits to use an eddy current is utilized.

(B) Cross Talk Noise

Such type of noise may be classified into two categories, i.e., an inductive noise and an electrostatic noise. There is a case where both the types of noise arise simultaneously in the event where a problem occurs actually, so that there is such a tendency that separation of both the types of noise is difficult.

(1) Inductive Cross Talk Noise

Figure 18A:
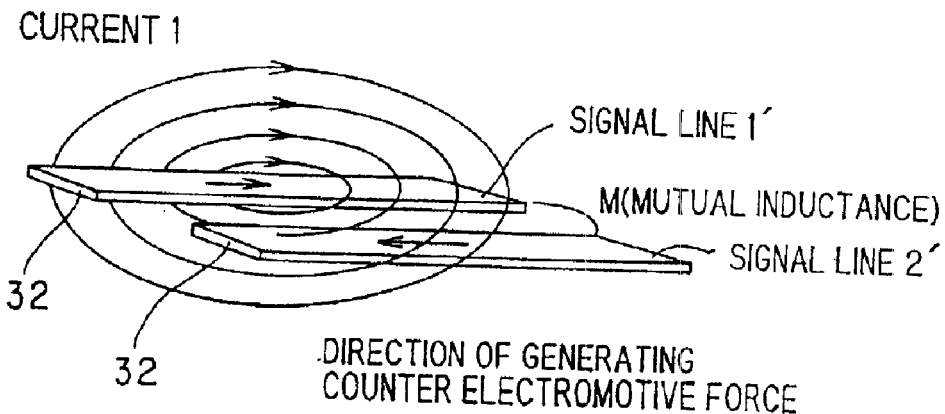
FIGS. 18(a) and (b) are views for each explaining a cross talk noise.
Figure 18B:
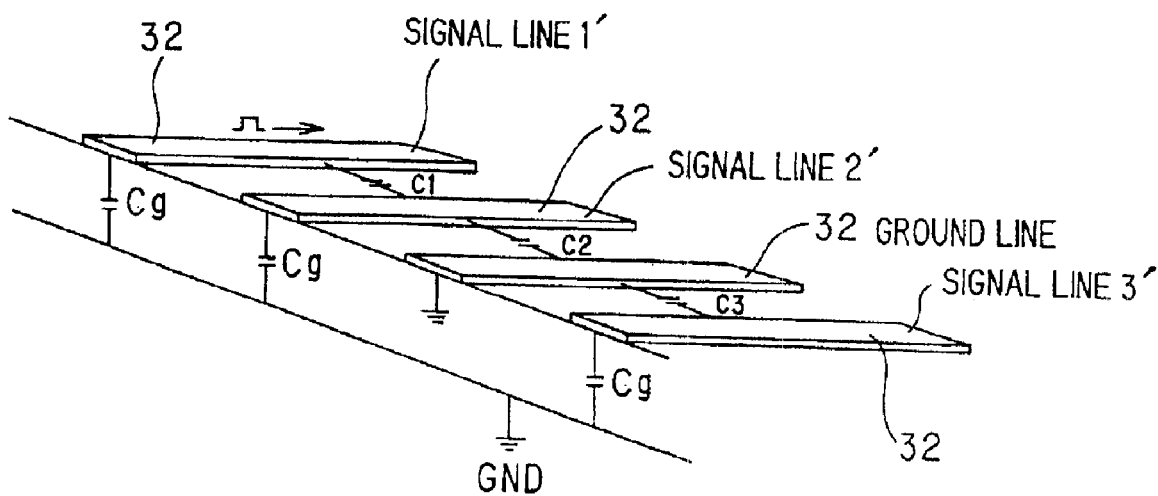

A magnetic flux generated by an electric current flowing through a certain line is interlinked with the adjacent line to determine a value of counter electromotive force V by a mutual inductance M existing between the adjacent lines, so that the mutual inductance M is related thereto. Since an eddy current Is produced in an electromagnetic shielding film (metallic foil) 22 disposed closely according to the present invention appears in such a manner that it reduces a magnetic flux itself, there is an effect for remarkably decreasing the mutual inductance M. In the second preferred embodiment, the measured data which was reduced as low as a value being smaller than that which was measured usually by about one digit was obtained. The effect of an eddy current Is appearing on the electromagnetic shielding film (metallic foil) 22 prevents from invasions of external noise into the inside, besides there is also an effect for preventing leak of noise generated in the inside. As shown in FIG. 18($a$), when a current I flows through a signal line 1' (corresponding to a signal lead 32), a counter electromotive force V=jωM×I appears on a signal line 2' (corresponding to a signal lead 32).

(2) Electrostatically Capacitive Cross Talk Noise

As a result of relations between electrostatic capacities C1, C2, and C3 formed between lines, a noise voltage appears on an adjacent line in the form of capacitive partial pressure. Since a noise voltage is determined by a ratio of partial pressure of an earth electrostatic capacity Cg as well as that of the electrostatic capacities C1, C2, and C3 produced between leads, there is no problem when the electrostatic capacities C1, C2, and C3 existing between the leads can be made small with respect to the earth electrostatic capacity Cg (see FIG. 18). As shown in FIG. 18($b$), when a signal pulse flows through the signal line 1', a voltage which has been capacitively voltage-divided according to a relationship expressed by the following equation (3) appears on the signal line 2'.

$$V2p=(Cg+C2)\times C1\times (Cg+C2)/(C1+C2+Cg)\times V2p \qquad (3$$

If a relationship C1<Cg is valid, there is no problem to be considered.

As is understood from the above description, since an eddy current flows on the electromagnetic shielding film (metallic foil) 22 which has been disposed at a position close to the signal line 32 in a direction wherein a magnetic flux produced by an current I flowing through the signal line 32 is canceled, inductances of the lines (self inductance as well as mutual inductance between leads) and inductive cross talk can be decreased, whereby speeding up in transmission of signal and data can be achieved.

(C) Reflection Noise

Reflection noise means such a phenomenon that when a variation occurs in characteristic impedance of a line in the case where a signal propagates through the line, the signal is reflected at a point of change. Since the reflected wave returns to its original state, deformation appears in the transmission waveform, a phenomenon as if a noise is added reach to an inlet of the semiconductor chip 1 differ from one another in every lines, operation timing in transistors becomes different from one another, so that there is a case where such difference comes to be a cause for erroneous operation. Accordingly, such difference has to be treated in the same manner with that of noise from the viewpoint of the fact to the effect that the former is a cause of erroneous operation, so that the former difference involved in a kind of noise. Therefore, the stricter control is necessary, when the higher frequency is utilized. Particularly, signal lines and a control circuit must be controlled as the objects for control.

TABLE 2

TRANSMISSION DISTANCE AND DELAY TIME (CALCULATED)

| DIELECTRIC CONSTANT OF INSULATIVE FILM | TRANSMISSION VELOCITY | TRANSMISSION DISTANCE | | | DELAY TIME |
|---|---|---|---|---|---|
| | | 2.5 nsec | 0.1 nsec | 10 psec | 1 mm LENGTH |
| 3.0 | 1.731E+11 mm/sec | 433 mm | 17 mm | 1.73 mm | 0.0058 nsec |
| 3.5 | 1.602E+11 mm/sec | 401 mm | 16 mm | 1.60 mm | 0.0062 nsec |
| 4.0 | 1.499E+11 mm/sec | 375 mm | 15 mm | 1.50 mm | 0.0067 nsec |
| 5.0 | 1.341E+11 mm/sec | 335 mm | 14 mm | 1.34 mm | 0.0075 nsec |
| 5.5 | 1.278E+11 mm/sec | 320 mm | 13 mm | 1.28 mm | 0.0078 nsec |
| 6.0 | 1.224E+11 mm/sec | 306 mm | 12 mm | 1.22 mm | 0.0082 nsec |
| 6.5 | 1.176E+11 mm/sec | 294 mm | 12 mm | 1.18 mm | 0.0085 nsec |
| 7.0 | 1.133E+11 mm/sec | 283 mm | 11 mm | 1.13 mm | 0.0088 nsec |

(LIGHT VELOCITY IS ASSUMED TO BE 2.998E+11 mm/sec)

is observed. As a matter of course, on and after the point of change, the signal reflected is not permeated, so that it results also in deformation of the waveform. Accordingly, a problem arises in the case where a frequency becomes very high so that the line must be handled as a distributed constant circuit. In this respect, a problem occurs in the case where a line length is in several millimeter in a frequency range according to the present invention (100 MHz to several GHz). In a relationship between a length of lead and a wavelength corresponding to a frequency, it is no need to consider its reflection noise with respect to a lead in a semiconductor chip a length of which is remarkably short.

There are many cases where problems arise principally with respect to lines on a wiring board, and in such cases, a board structure wherein lines are designed for keeping a characteristic impedance constant may be adopted. A portion where such countermeasure as described above is most difficult to be taken is a wiring section of a package. A line length of the portion corresponds to several millimeter length. While there is a side based on which a certain degree of a phenomenon can be understood qualitatively even in a lumped parameter circuit, it is necessary for analyzing the phenomenon by means of a distributed constant circuit to quantitatively hold down the phenomenon.

(D) Transmission Delay

Even if it is a signal, it propagates physically so that transmission speed and transmission time should be considered. In case of the second preferred embodiment, since a wiring section is provided on a polyimide resin film (insulating film), a transmission speed of signal is determined by a dielectric constant of polyimide resin. Results determined with respect to a relationship between a dielectric constant and a transmission speed of signal are shown in Table 2. In Table 2, calculation was made in a condition where a speed of light was (2.998E+11) mm/sec. When periods of time wherein signals propagating simultaneously While a semiconductor memory (memory) has been applied as the semiconductor device of the present invention in the second preferred embodiment, it will be clear from the aforementioned description that the invention is not limited thereto.

Advantageous effects achieved by typical technologies involved in the inventions disclosed in the present application are summarized as follows.

(1) Since a predetermined wiring section is disposed on an insulation board and an electrostatic shielding film (metallic foil) is placed at a position close to the wiring section, an eddy current flows on the electromagnetic shielding film placed at a position close to the wiring section in a direction wherein a magnetic flux produced by a current flowing through the wiring section of a wiring board is canceled. As a result, inductances (self inductance and mutual inductance between leads) of the wiring section as well as inductive cross talk can be reduced, whereby it is intended to improve reliability of electric signals and to speed up for transmission speed.

(2) Since an electromagnetic shielding film is disposed on a surface of a semiconductor chip, on which an integrated circuit has been formed, through an insulating film and leads are placed on the electrostatic shielding film through an insulating film, an influence of electromagnetic wave which affects the semiconductor chip is prevented. As a result, it is possible to reduce addition of noise to signals such as clock signals in a driving voltage or a transmission path. Furthermore, when an electromagnetic shielding film is provided at a position close to a signal lead, an inductance of the signal lead can be reduced, so that it makes possible to increase a signal transmission speed, whereby it can be intended to speed up an operation speed of a device.

(3) Due to the advantageous effects described in the above Items (1) and (2), since a signal transmission speed in an electronic device can be increased, speeding up of an operation speed for the device is attained.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A semiconductor device, comprising:

a semiconductor chip;

an insulation board for mounting said semiconductor chip on one surface;

an electromagnetic shielding film formed on another surface of said insulation board;

an insulating film formed on said electromagnetic shielding film;

a wiring formed on said insulating film;

a lead for electrically connecting an external terminal of said semiconductor chip with said wiring; and a sealing material for sealing said semiconductor chip formed on said insulation board, wherein the electromagnetic shielding film formed on said another surface of said insulation board is electrically isolated.

2. A semiconductor device according to claim 1, wherein the electrically isolated electromagnetic shielding film formed on said another surface of said insulation board is disposed to reduce a magnetic flux density of a magnetic field generated by said wiring.

3. A semiconductor device according to claim 2, wherein the electromagnetic shielding film formed on said another surface of said insulation board is disposed to create, from a magnetic flux generated by said wiring, an eddy current in a direction which cancels at least a portion of the magnetic flux.

4. A semiconductor device, comprising:

a wiring board comprising;

a first insulation board, a predetermined wiring section disposed on one surface of said insulation board, and a first electromagnetic shielding film placed at a position close to said wiring section; and a semiconductor device mounted on said wiring board comprising:

a semiconductor chip;

a second insulation board for mounting said semiconductor chip on one surface;

a second electromagnetic shielding film formed on another surface of said second insulation board;

an insulating film formed on said second electromagnetic shielding film;

a wiring formed on said insulation film;

a lead for electrically connecting an external terminal of said semiconductor chip with said wiring; and a sealing material for sealing said semiconductor chip formed on said second insulation board, wherein the first electromagnetic shielding film and the second electromagnetic shielding film placed are electrically isolated.

5. A semiconductor device according to claim 4, wherein the first electromagnetic shielding film and the second electromagnetic shielding film are disposed to reduce a magnetic flux density of a magnetic field generated by at least one of said predetermined wiring section disposed on one surface of said insulation board, said wiring formed on said insulation film, and said lead for electrically connecting an external terminal of said semiconductor chip with said wiring.

6. A semiconductor device according to claim 5, wherein the first electromagnetic shielding film and the second electromagnetic shielding film are disposed to create, from a magnetic flux generated by said at least one of said predetermined wiring section disposed on one surface of said insulation board, said wiring formed on said insulation film, and said lead for electrically connecting an external terminal of said semiconductor chip with said wiring, an eddy current in a direction which cancels at least a portion of the magnetic flux.

* * * * *